United States Patent

Schilling

[15] 3,702,947

[45] Nov. 14, 1972

[54] MONOLITHIC DARLINGTON TRANSISTORS WITH COMMON COLLECTOR AND SEPERATE SUBCOLLECTORS

[72] Inventor: Harald Schilling, Freiburg, Germany

[73] Assignee: ITT Industries, Inc., New York, N.Y.

[22] Filed: Oct. 14, 1971

[21] Appl. No.: 189,113

[30] Foreign Application Priority Data

Oct. 21, 1970 Germany...........P 20 51 536.0

[52] U.S. Cl.................307/303, 307/315, 317/235 E, 317/235 AM, 330/38 M

[51] Int. Cl...............................................H01l 19/00

[58] Field of Search .........307/303, 315; 317/235 E, 317/235 AM; 230/38 M

[56] References Cited

UNITED STATES PATENTS

| | | | |
|---|---|---|---|
| 3,244,950 | 4/1966 | Ferguson | 317/235 AM |
| 3,500,140 | 3/1970 | Makimato et al. | 317/235 E |
| 3,564,443 | 2/1971 | Nagata | 317/235 E |
| 3,573,573 | 4/1971 | Moore | 317/235 E |

*Primary Examiner*—James D. Kallam
*Assistant Examiner*—William D. Larkins
*Attorney*—C. Cornell Remsen, Jr. et al.

[57] ABSTRACT

The saturation voltage of a monolithic integrated Darlington circuit consists of the collector emitter saturation voltage of the driver transistor and the base-emitter threshold voltage of the end transistor. The collector current of the end transistor flows over a semiconductor region which is in common with the collector circuit of the driver transistor causing the saturation voltage to rise. This problem is solved by dividing the usually mutual buried layer of the two transistors into two separate buried layers.

2 Claims, 4 Drawing Figures

INVENTOR

HARALD SCHILLING

BY Vincent B. Ingrassia

AGENT

MONOLITHIC DARLINGTON TRANSISTORS WITH COMMON COLLECTOR AND SEPERATE SUBCOLLECTORS

BACKGROUND OF THE INVENTION

The present invention relates to a monolithic integrated semiconductor circuit having substrate of the one conductivity type, and an epitaxial layer of the other conductivity type arranged thereon, with a highly doped intermediate layer of the same conductivity type as the epitaxial layer with an insulating region penetrating the epitaxial layer and forming an insulating island with the substrate, with at least two transistor structures having one common collector, being arranged in one such insulating island, and so connected that one portion of the emitter current of the one transistor structure will flow via the collector emitter path of the other transistor structure. One example of such a monolithic integrated semiconductor circuit is the well-known Darlington amplifier including two transistor structures.

In the case of a discrete construction of such circuit arrangements of individual transistor, the saturation voltage, i.e. the minimum voltage as occuring between the common collector and the emitter of the second transistor, is composed of a part determined by the first transistor, and of a part determined by the second transistor. In the case of the part determined by the first transistor, there is concerned the collector-emitter saturation voltage of this transistor while in the case of the part determined by the second transistor, there is concerned the forward threshold voltage of the base-emitter diode of this transistor. These two parts are added to one another. If in distinction to the discrete arrangement, the two transistors are monolithic integrated, there will result an increase of the saturation resistance and therefore the saturation voltage owing to the common collector.

SUMMARY OF THE INVENTION

It is an object of the present invention to provide a monolithic semiconductor circuit of the type described above which avoids the increase of the saturation resistance and therefore the saturation voltage owing to the common collector resistance.

According to a broad aspect of the invention there is provided a monolithic integrated semiconductor circuit comprising a substrate of one conductivity type, an epitaxial layer having a conductivity opposite to that of said substrate and arranged thereon, and insulating region penetrating said epitaxial layer and forming an insulating island with said substrate, at least two transistor structures having one common collector arranged in said insulating island, and so connected that one portion of the emitter current of one transistor structure will flow via the collector-emitter path of the other transistor structure and an intermediate layer having the same conductivity as that of said epitaxial layer arranged between said substrate and said epitaxial layer, said intermediate layer divided in such a way that below the collector-base pn-junction of each of said at least two transistor structures there is a portion of said intermediate layer separated from that of the other transistor structure by said epitaxial layer.

The above and other objects of the present invention will be better understood from the following detailed description taken in conjunction with the accompanying drawings, in which:

DESCRIPTION OF THE PREFERRED EMBODIMENT

Figure 1:
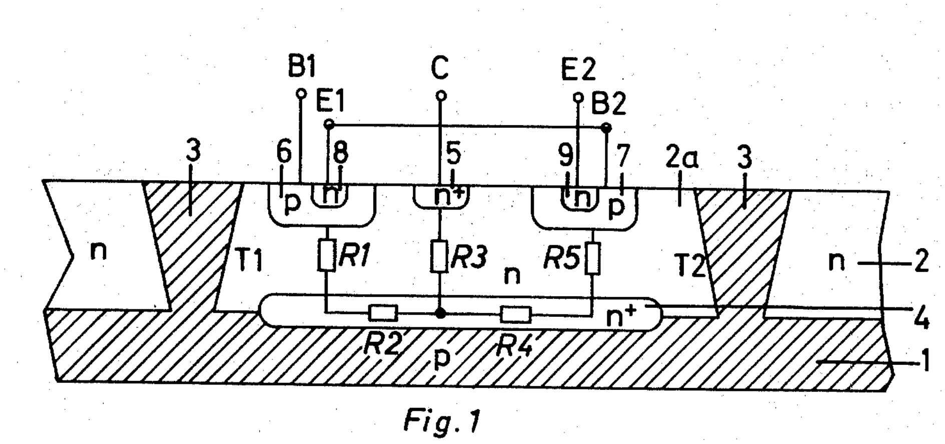
FIG. 1 shows a sectional view of an integrated Darlington amplifier.

Referring to FIG. 1, there is shown a sectional view of an integrated arrangement of the known Darlington amplifier.

On the P-conductive semiconductor body 1 there is arranged the N-conductive epitaxial layer 2 through which extends the likewise p-conductive insulating zone 3. Between the epitaxial layer 2 and the substrate 1 there is arranged the $N^+$-conductive, hence highly doped intermediate layer 4 sometimes also referred to as a buried layer. The insulating zone 3 and the semiconductor substrate cut an insulating island out of the epitaxial layer 2, in which the two transistor structures T1 and T2 are arranged. The portion *2a* of the epitaxial layer 2 as lying within the insulating island, serves as the common collector zone of the two transistor structures T1 and T2, and inserted into this zone at a suitable portion of the surface, is the $N^+$-conductive contact zone 5 which is connected to the outer common collector terminal C.

The two transistor structures T1 and T2 respectively consist of the p-conductive base zones 6 and 7 as inserted into the surface of the epitaxial layer and into which, in turn, there are inserted the N-conductive emitter zones 8 and 9. The respective terminals of these zones are indicated by the references B1, B2 or E1, E2. In the present example the terminals E1 and B2 are connected to one another, i.e. the emitter zone of the transistor structure 1 is conductively connected to the base zone of the transistor structure T2, so that there will result the configuration of a Darlington amplifier. Accordingly, during operation of this monolithic integrated semiconductor circuit one portion of the emitter current of the transistor structure T2 will flow over the collector-emitter path of the transistor structure T1.

If, the two transistors are integrated in the manner as shown in FIG. 1, there will result a current path in the epitaxial layer 2a between the $N^+$doped collector contact zone 5 and the intermediate layer 4, which is common to the collector currents of both transistor structures. This is illustrated in FIG. 1 in that the semiconductor regions through which the two collector currents flow, are symbolized by their ohmic resistances which are indicated along the current path.

Thus, the collector current of the transistor structure T1 flows through the equivalent resistor R1 representing the partial resistance of the epitaxial layer *2a* between the collector-base PN-junction area of the transistor structure T1 and the highly doped intermediate layer 4, thereupon over a portion of the intermediate layer 4 which is represented by the equivalent resistor R2, and finally over the equivalent resistor R3 representing the partial resistance of the epitaxial layer 2*a* between the collector contact zone 5 and the intermediate layer 4.

Figure 2:
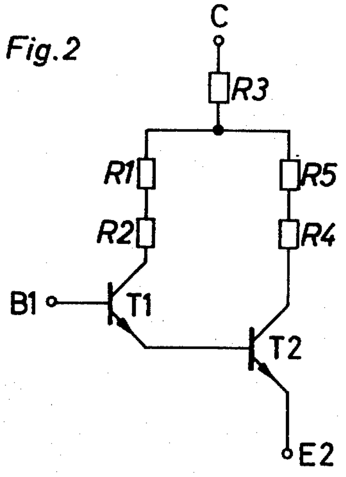
FIG. 2 shows the equivalent electrical circuit diagram relating to FIG. 1.

The collector current of the transistor structure T2 flows through the equivalent resistors R5 and R4 corresponding to the equivalent resistors R1 and R2, and thereafter through the same equivalent resistor R3. In FIG. 2 these conditions are shown in the form of an electrical equivalent circuit diagram. It will be seen that the resistor R3 is common to the collector circuits of the two transistor structures T1 and T2.

Accordingly, however, the collector-emitter current of the transistor structure T1 also flows through the common resistor R3 thus causing, across it, a corresponding voltage drop increasing the saturation voltage of the entire arrangement.

Figure 3:
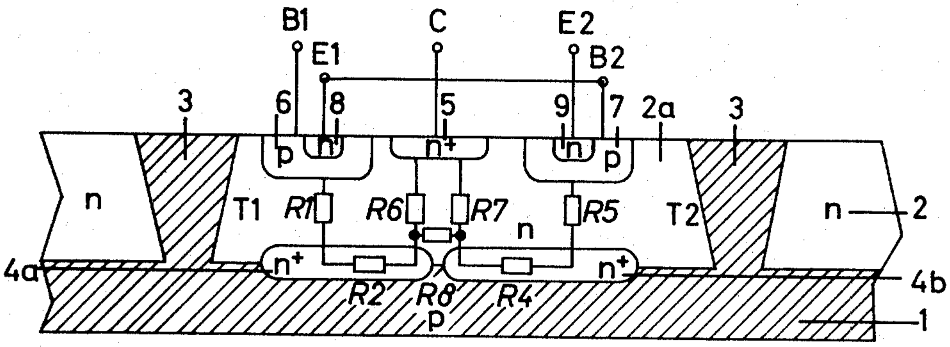
FIG. 3 shows the inventive semiconductor circuit.

FIG. 3, in its substantial parts, corresponds to the arrangement according to FIG. 1; identical parts are indicated by the same reference numerals. According to the proposal of the invention, the intermediate layer 4 according to FIG. 1 is divided into the partial intermediate layers 4*a* and 4*b* which are separated from one another by the epitaxial layer material. Each of the partial intermediate layers is positioned below the collector-base pn-junction area of the associated transistor structure, hence the partial intermediate layer 4a below the collector-base pn-junction area belonging to the transistor structure T1, and the partial intermediate layer 4*b* below the collector-base PN-unction area belonging to the transistor structure T2. In further embodying the invention the square dimension of the collector contact zone 5 is chosen thus that the projection thereof partly overlaps each of the partial intermediate layers 4*a* and 4*b*.

When considering now the collector currents of the individual transistor structures are flowing in this semiconductor circuit, in the same way as done previously with reference to FIG. 1, it will be seen that the collector current of the transistor structure T1 again flows across the equivalent resistors R1 and R2, but now also across the equivalent resistor R6 representing the partial resistance of the epitaxial layer 2*a* between the collector contact zone 5 and the partial intermediate layer 4*a*. The collector current of the transistor structure T2 again flows across the equivalent resistors R5 and R4, but then across the equivalent resistor R7 representing the partial resistance between the collector contact zone 5 and the partial intermediate layer 4*b*. Consequently, the common equivalent resistor R3 according to FIG. 1. has been split up by the inventive embodiment into two equivalent resistors R6 and R7 so that now the collector current of the transistor structure T1 will no longer flow across a resistor which is common to the collector circuit of the transistor structure T2. In consequence of this, however, also the collector current of the transistor structure T1 can no longer cause an additional voltage drop increasing the saturation voltage.

Of course, the equivalent resistors R6 and R7 are connected to one another across the equivalent resistor R8 representing the partial range of the epitaxial layer 2*a* as lying between the equivalent resistors R6 and R7, but since this resistor R8 is high-ohmic with respect to R8 or R7 (R8 about 50 · R6 or 50 · R7 respectively) there will result a good decoupling between the equivalent resistors R6 and R7.

Figure 4:
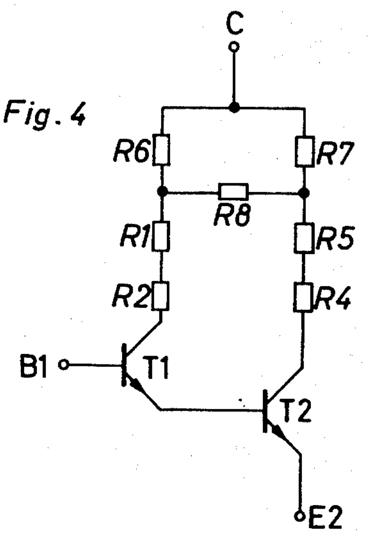
FIG. 4 shows the equivalent electrical diagram relating to the inventive semiconductor circuit.

FIG. 4 shows the electrical equivalent circuit diagram of the semiconductor circuit according to FIG. 3, showing that the collector current of the transistor structure T1 is now only still coupled across the high-ohmic resistor R8 to the collector circuit of the transistor structure T2. By means of a star-mesh transformation it can be proved that owing to the coupling across the resistor R8, the resistance now corresponding to the resistor R3 is substantially lower, so that the voltage dropping off across it, will supply a contribution towards the saturation voltage of the entire arrangement which is reduced to the same extent.

It will be clearly evident that the inventive embodiment can be employed not only in the case of two transistor structures within one insulating island, but is equally well of advantage in the case of three or more transistor structures. Relative thereto, such arrangements of the individual transistor structures are particularly appropriate which are in such a way distributed over the surface of the insulating island that in a plan view the individual transistor structures are arranged around the common collector contact. However, it may also be of advantage to provide only individual partial groups of transistor structures with one common collector contact, and to assign to another partial group a common collector contact of its own. Also in this case the intermediate layer is divided into the individual partial intermediate layers according to the teaching of the invention.

It is to be understood that the foregoing description of specific examples of this invention is made by way of example only and is not to be considered as a limitation on its scope.

I CLAIM:

1. A monolithic integrated semiconductor circuit comprising:

a substrate;

an epitaxial layer on said substrate having a given conductivity type;

an isolating region penetrating said epitaxial layer and forming an isolated island with said substrate;

at least two transistors having one common collector and seperate bases and emitters in said island, and conducting means for connecting the base of one of said transistors and the emitter of the other of said transistors; and an intermediate layer having the same conductivity as but of lower resistivity than that of said epitaxial layer arranged between said substrate and said epitaxial layer, said intermediate layer divided into two portions, with one of said portions lying below the base of each of said two transistors, said two portions being seperated from each other by a part of said epitaxial layer.

2. A semiconductor circuit according to claim 1, further comprising a contact zone for making electrical connection to the common collector of said two transistors, said contact zone overlying each of said portions of said intermediate layer and said part of said epitaxial layer.

* * * * *